United States Patent [19]
Austin et al.

[11] Patent Number: 5,151,249
[45] Date of Patent: Sep. 29, 1992

[54] NICKEL-BASED SINGLE CRYSTAL SUPERALLOY AND METHOD OF MAKING

[75] Inventors: Curtiss M. Austin, Loveland; Ramgopal Darolia, Cincinnati, both of Ohio; Kevin S. O'Hara, Boxford, Mass.; Earl W. Ross, Cincinnati, Ohio

[73] Assignee: General Electric Company, Cincinnati, Ohio

[21] Appl. No.: 459,400

[22] Filed: Dec. 29, 1989

[51] Int. Cl.⁵ .............................................. C22C 19/03
[52] U.S. Cl. .................................... 420/445; 420/443; 148/428; 148/404; 148/675
[58] Field of Search ................ 420/445, 443; 148/428, 148/404, 162, 13.1, 11.5 N

[56] References Cited
U.S. PATENT DOCUMENTS

| | | | |
|---|---|---|---|
| 4,169,742 | 10/1979 | Wukusick et al. | 148/32.5 |
| 4,830,679 | 5/1989 | Yamagata et al. | 148/3 |

FOREIGN PATENT DOCUMENTS

| | | |
|---|---|---|
| 0150917 | 8/1985 | European Pat. Off. |
| 0208645 | 1/1987 | European Pat. Off. |
| 2374427 | 7/1978 | France. |
| 2191505 | 12/1987 | United Kingdom. |

Primary Examiner—Deborah Yee
Attorney, Agent, or Firm—Carmen Santa Maria; Jerome C. Squillaro

[57] ABSTRACT

A nickel-based superalloy consisting essentially of, in weight percent, from about 4 to about 5 percent chromium, from about 11 to about 14 percent cobalt, from about 4 to about 8 percent tungsten, from about 6 to about 10 percent tantalum, from about 5 to about 7 percent aluminum, from about 5.5 to about 8 percent rhenium, from about 0 to about 0.50 percent hafnium, from about 0 to about 0.07 percent carbon, from 0 to about 0.01 percent boron, from 0 to about 0.030 percent yttrium, from 0 to about 6 percent ruthenium, from 0 to about 1 percent molybdenum, from 0 to about 1 percent niobium, and the balance essentially nickel. Articles made from the superalloy of the invention are especially useful when cast as single crystal airfoils for use in advanced gas turbine engines.

35 Claims, 4 Drawing Sheets

NICKEL-BASED SINGLE CRYSTAL SUPERALLOY AND METHOD OF MAKING

BACKGROUND OF THE INVENTION

This invention relates to nickel-based superalloys, and, more particularly, to compositions of single crystal superalloys and articles made from such compositions.

One of the most demanding materials applications is found in turbine components used in aircraft jet engines; the higher the operating temperature of an engine, the greater its efficiency, and the more power it can produce from each gallon of fuel. There is, therefore, an incentive to operate such engines at as high a temperature as possible. Among the critical limitations on the operating temperature of an engine are the materials used for applications in the hottest regions of the engine, such as turbine airfoils.

There has been a great deal of effort over the past 40 years to develop materials that can be used in high temperature gas turbine components. The most popular and successful of such materials are the nickel-based superalloys, which are alloys of nickel with additions of a number of other elements such as chromium, molybdenum, titanium, tungsten, cobalt, aluminum, tantalum and many others. The compositions of these superalloys are carefully engineered to maintain their strength and other desirable properties during extended use at the high temperatures of engine operations, which are in the neighborhood of 2000° F. and higher.

In addition to the selection of the best composition for use in each component, high operating temperatures of gas turbine components are attained by other techniques. For example, cooling passages may be provided through the components so that cooling air bled from the engine may be passed through the components to cool them internally and also to cool the surfaces as by film cooling.

In another approach, the gas turbine components may be cast as single crystals of the selected superalloy. Particular crystallographic directions, such as [001] in face-centered cubic superalloys, exhibit a balance of mechanical properties superior to those measured in other directions and in polycrystalline articles. The turbine component is therefore cast as a single crystal of that orientation, with the result that the mechanical properties, particularly low cycle fatigue, are improved as compared with other structures made of the same alloy. The alloy compositions of such single crystal alloys are beneficially adjusted because of the absence of grain boundaries that would otherwise require strengthening. There is an ongoing need for making superalloy compositions useful in single crystal articles having improved mechanical and other properties of interest in high-temperature superalloy applications. The present invention fulfills this need, and further provides related advantages.

The term "balance essentially nickel" is used to include, in addition to nickel in the balance of the alloy, small amounts of impurities and incidental elements, which in character and/or amount do not affect the advantageous aspects of the alloy.

SUMMARY OF THE INVENTION

The present invention provides nickel-based superalloy compositions which may be made as single crystal articles having significantly improved mechanical properties, improved resistance to environmental attack such as oxidation and hot corrosion, excellent phase stability and resistance to formation of embrittling phases during high temperature use, and excellent density-corrected strength. These superalloy compositions and articles made from them can be operated at temperatures as much as 50° F. greater than those using prior art superalloys. The present invention also provides a novel method for making nickel-based superalloy compositions, including those of the present invention, requiring a solution treatment at a temperature above 2400° F.

In accordance with the invention, there is provided nickel-based superalloys which consist essentially of, in weight percent, from about 4 to about 5 percent chromium, from about 11 to about 14 percent cobalt, from about 4 to about 8 percent tungsten, from about 6 to about 10 percent tantalum, from about 5 to about 7 percent aluminum, from about 5.5 to about 8 percent rhenium, from about 0 to about 0.50 percent hafnium, from about 0 to about 0.07 percent carbon, from about 0 to about 0.01 percent boron, from about 0 to about 0.030 percent yttrium, and the balance essentially nickel.

Ruthenium in an amount up to about 6 percent may advantageously be added. Molybdenum in an amount up to about 1 percent may be added. It is preferred that the titanium and vanadium contents be maintained as low as possible for optimum resistance to environmental damage, such as that due to oxidation and hot corrosion. Niobium, a potent strengthening addition, is maintained low, up to about 1 percent, and not included in the most preferred embodiment because it reduces resistance to environmental damage.

The superalloy compositions may be made in the form of a single crystal. Articles made from the superalloy composition of the invention exhibit excellent high temperature creep-rupture resistance, oxidation resistance, hot corrosion resistance, and a moderate specific density. Articles made from the superalloys of the present invention are particularly suited for use in the hostile environment of a gas turbine engine, and, in particular, as a turbine airfoil in a gas turbine engine. Other features and advantages of the invention will be apparent from the following more detailed description of the invention, taken in conjunction with the accompanying drawings, which illustrate, by way of example, the principles of the invention.

DESCRIPTION OF THE PREFERRED EMBODIMENT

In accordance with the most preferred embodiment of the invention, a nickel-based superalloy consists essentially of, in weight percent, about 4.5 percent chromium, about 12.5 percent cobalt, about 5.7 percent tungsten, about 7 percent tantalum, about 6.1 percent aluminum, about 6.2 percent rhenium, about 0.15 percent hafnium, about 0.05 percent carbon, about 0.004 percent boron, and the balance essentially nickel.

Figure 1:
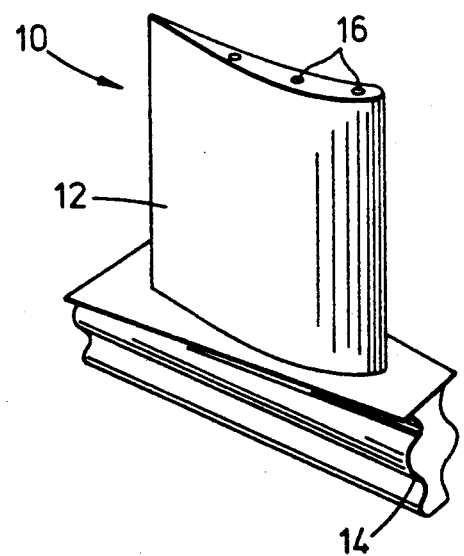
FIG. 1 is a perspective drawing of a turbine blade.

This composition is cast into an article for use as a component in a gas turbine engine, and preferably into a single crystal article, such as the turbine blade 10 of FIG. 1. The turbine blade 10 includes an airfoil section 12 against which hot combustion gases are directed when the engine operates. The airfoil section 12 is anchored to a turbine disk (not shown) through a root section 14. Cooling passages 16 may be present through the airfoil section 12, through which engine bleed air is forced, to carry away heat from the blade 10.

The turbine blade 10 is prepared as a single crystal, preferably with the [001] crystallographic axis parallel to the lengthwise direction of the blade. There are two commonly practiced procedures for accomplishing such directional solidification, the seed crystal technique and the choke process. In the seed crystal technique, an oriented seed crystal is grown into the liquid superalloy by unidirectionally propagating the liquid-solid interface. In the choke technique, the interface between liquid and solid is unidirectionally propagated through a labyrinth passage in a mold, with the result that the fastest growing face centered cubic (fcc) orientation, [001], emerges as the dominant growth direction. Any other technique that produces a single crystal article may also be used with the present invention.

The superalloy of the invention is a gamma/gamma prime alloy. The gamma phase is a solid solution strengthened, face centered cubic phase that constitutes about 35 percent by volume of the superalloy, when heat treated as described herein. The gamma prime phase is an intermetallic phase, generally of the form $Ni_3Al$, which also is solid solution-strengthened, and occupies about 65 percent by volume of the superalloy.

The gas turbine engine component cast from the superalloy of the present invention is heat treated to attain the optimum gamma/gamma prime microstructure. Any appropriate solutioning heat treatment may be used. A preferred heat treatment is to heat the component to about 2300° F. for about two hours to homogenize the microstructure, gradually raise the temperature from about 2300° F. to a solutioning temperature of about 2415° F. at a rate of about 10 degrees per hour, then maintain the component at that temperature for about two hours, followed by cooling to a temperature of about 2050° F. in three minutes or less. This solutioning treatment is selected to achieve at least about 95 percent solutioning of the gamma prime. This solutioning treatment is selected to achieve less than about two percent incipient melting of the alloy in the airfoil section and less than about five percent incipient melting in the root section.

After cooling from the solution temperature to an aging temperature of about 2050° F. in three minutes or less, the component is primary aged at this temperature to achieve the desired microstructure. The preferred aging time is about four hours. The component is normally coated with any appropriate protective coating, which requires cooling to about 1975° F. (from 2050° F.) in a time of about one minute and holding at this temperature for about four hours. The component is then cooled to about 1650° F. in less than six minutes and held at this temperature for about four hours, before cooling to ambient temperature.

The particular alloying elements in the superalloy composition of the invention, and their quantitative amounts and limits, were selected with attention to their properties in combination. That is, the presence and amount of each element was selected with consideration of the effect of the other alloying elements in the superalloy. These properties include the strength, fatigue, and creep-rupture properties of the alloy, the resistance of the alloy to the formation of unstable brittle phases during elevated temperature exposure, the density of the alloy, and the environmental resistance of the alloy to oxidation and hot corrosion damage.

The chromium content, most preferably about 4.5 weight percent, should not be less than about 4 weight percent nor more than about 5 weight percent. (All compositional percentages herein are by weight.) Chromium is added principally because of its beneficial effects on hot corrosion resistance and oxidation resistance. If the amount of chromium is less than about 4 percent, the hot corrosion resistance falls to unacceptably low levels. However, the chromium content is reduced below the level prevalent in many other superalloys because an amount higher than about 5 weight percent contributes to microstructural instability which may occur during extended service at high temperatures. Specifically, there may be formed in superalloys, after extended high-temperature exposure, undesirable, brittle phases called topologically close packed (TCP) phases. Chromium is one of the elements that may contribute to an increased tendency to form TCP phases, and the limitation on the maximum chromium content helps to avoid formation of TCP phases. The preferable range of chromium is from about 4.25 to about 4.75 percent.

The cobalt content is about 12 to about 13 percent, most preferably about 12.5 percent, and should not be less than about 11 percent or more than about 14 percent. The preferred range of cobalt is from about 12.25 to about 12.75 percent. This cobalt content is significantly higher than that typically found in nickel-based single crystal superalloys. In the present alloy, cobalt aids in stabilizing against the formation of TCP phases during extended operation at elevated temperature. If the cobalt content is less than about 11 percent, the stability against TCP phase formation is reduced. If the cobalt content is greater than about 14 percent, the rupture strength and oxidation resistance of the alloy are reduced.

The tungsten content ranges from about 4 to about 8 percent, and is most preferably about 5.7 percent. Tungsten partitions to both the gamma and gamma prime phases, and serves to strengthen each phase by solid solution strengthening. However, tungsten is a dense element, and its presence undesirably increases the density of the alloy. If the tungsten content is below about 4 percent, the strength of the superalloy is insufficient, and in particular, the strength of the gamma phase deteriorates. If the tungsten content is greater than about 8 percent, the density is significantly increased, the oxidation and hot corrosion resistance are reduced and there is a tendency to promote formation of TCP phases. The preferred range of tungsten is from about 5.6 to about 5.9 percent.

Tantalum is present in an amount of from about 6 percent to about 10 percent, desirably from about 6 to about 8 percent, preferably from about 6.8 to about 7.2 percent, and most preferably about 7 percent. Tantalum primarily strengthens the gamma prime phase of the alloy, provides resistance to hot corrosion, and resists formation of fine equiaxed grains on the surface of the casting, commonly known as freckles. If the tantalum content is below about 6 percent, the strength of the alloy is low. If the tantalum content is above about 10 percent, the density of the alloy is undesirably increased.

Aluminum is present in an amount of from about 5 to about 7 percent, preferably from about 6.0 to about 6.2 percent, and most preferably about 6.1 percent. Aluminum is the key alloying element in the formation of the gamma prime phase, and also contributes to oxidation resistance by contributing aluminum to surface aluminum oxides. If the aluminum content is below about 5 percent, there is an insufficient volume fraction of gamma prime phase to achieve good creep-rupture strength, and the oxidation resistance of the alloy is low. If the aluminum content is above about 7 percent, there is an increased tendency to form the brittle TCP phases during extended exposure at elevated temperatures. When the aluminum content is greater than about seven percent, the alloy becomes difficult to solution, and there is an unacceptable amount of incipient melting.

Rhenium is present in an amount of from about 5.5 to about 8 percent, desirably 5.7 to about 7 percent, preferably about 6.0 percent to about 6.4 percent, and most preferably about 6.2 percent. Rhenium, while relatively dense, is a potent solid solution strengthening element in the gamma phase and is important in achieving high temperature strength. In the present alloy, rhenium has been substituted for other, less potent solid solution strengthening elements such as molybdenum, which is preferably omitted entirely in this alloy, and chromium, which is present in the alloy at a reduced level as compared with other superalloys. The rhenium content of the present alloy is significantly greater than the rhenium content of other prior art superalloys. If the rhenium content is below about 5.5 percent, the high temperature strength of the alloy is insufficient. If the rhenium content is above about 8 percent, there is an increased tendency to form TCP phases during extended exposure at elevated temperatures. As the amount of rhenium is increased, there also is a weight penalty and a cost penalty because of the respective density and cost of rhenium.

Yttrium improves oxidation resistance. It is present in these alloys in an amount of from 0 to about 0.030 percent. Although not necessary, some yttrium is desirable for improved oxidation resistance. Thus, about 0.002 percent to about 0.030 percent is preferable. The presence of yttrium is believed to affect only the environmental properties and appears to have no effect on mechanical properties.

Hafnium, carbon, and, particularly, boron are grain boundary strengthening elements. It has been conventional practice to omit them entirely from single crystal alloys. However, they are provided in relatively low levels in the present alloy to promote strengthening of low angle grain boundaries that are inevitably present even in crystals that are nominally single crystals. Where these elements are omitted from the alloy, low angle boundaries having misorientations greater than about 6 degrees are unacceptable in an article, and any such article cast with higher angle boundaries must be discarded. Including these three elements provides sufficient strengthening of the boundaries that articles having boundary misorientations of up to about 12 degrees are acceptable. Thus, these elements improve the producibility of the articles, by reducing the fraction of articles that must be rejected. Better reliability in service also results.

Although some addition of each of hafnium, carbon and boron is desirable in the alloy, too much of these elements may be detrimental. Hafnium, up to about 0.50 percent, is included. If the hafnium content exceeds about 0.50 percent, the alloy melting point is depressed and the gamma prime solvus temperature may be depressed to the point that heat treatments are not possible. The preferred hafnium content is in the range of about 0.12 percent to about 0.18 percent, and most preferably, about 0.15 percent. Carbon, up to about 0.07 percent, is included. If the carbon content exceeds about 0.07 percent, the excess carbon segregates and forms carbides in the microstructure that serve as initiation points for fatigue cracks, thereby reducing the fatigue strength. The preferred carbon content is in the range of about 0.04 percent to about 0.06 percent, and most preferably, about 0.05 percent. Boron, up to about 0.01 percent, may be included. However, more than about 0.0075 percent boron reduces the melting point of the alloy, leading to incipient melting. Up to about 0.01 percent boron is tolerated, before the melting point is unacceptably reduced. The preferred boron range of about 0.0030–0.0050 percent, and most preferably, about 0.004 percent, provides grain boundary strengthening without significant melting point depression.

Ruthenium may optionally be added to the present alloy in amounts up to about 6 percent. Ruthenium is a solid solution strengthening element for the gamma and gamma prime phases, and, like cobalt, aids in stabilizing these phases against the formation of brittle TCP phases during high temperature service. However, ruthenium has a higher density than cobalt, undesirably adding to the density of the alloy and may degrade environmental properties, such as hot corrosion resistance and oxidation resistance in certain alloy combinations. Ruthenium is also expensive, costing about $1000 per pound at the present time and is currently available from a single source so that it may become unavailable in the future for geopolitical reasons. Because of these considerations, the amount of ruthenium is minimized, preferably to amounts less than about three percent.

There are several elements that are often included in nickel-based superalloys for various reasons, but, in the alloys of the present invention, preferably are either excluded or included at restricted levels. Molybdenum is a strengthening element for the gamma phase. However, molybdenum is also detrimental to oxidation and hot corrosion resistance and contributes to alloy instability by the formation of TCP phases. In the present alloy, although molybdenum up to about one percent is tolerated, it is preferably reduced to zero.

Titanium may substitute for aluminum in the gamma prime phase, so that the resulting phase is $Ni_3(Al,Ti)$. However, titanium tends to decrease the melting point of the superalloy. Moreover, its presence is significantly detrimental to oxidation resistance. Thus, the titanium content of the present alloys is reduced, preferably to zero.

Niobium and vanadium can substitute for tantalum, titanium and aluminum as gamma prime forming elements, resulting in a gamma prime phase of the form $Ni_3(Al,Ta,Ti,Nb,V)$. However, vanadium is significantly detrimental to oxidation and hot corrosion resistance. Although vanadium may be present at reduced levels, possibly as high as 0.5 percent, it is desirable that vanadium be present only in very small quantities, preferably zero. Niobium is a strengthening element, but it reduces the oxidation and hot corrosion resistance of the alloy. Niobium is present in the superalloys of the present invention at levels of from 0 to at most 1 percent.

The following examples illustrate the properties of superalloys made in accordance with the invention and in comparison with those outside the scope of the invention. Although these examples should be taken as illustrative of the invention and its relation to other superalloys and articles, they should not be viewed as limiting the scope of the invention in any respect.

A large number of alloy test materials was prepared to investigate the compositional variations and ranges for the superalloys of the present invention. Representative alloy compositions of those tested are presented in Table I below. Alloys tested which fall outside the scope of the present invention are preceded by a pound symbol (#).

TABLE I

| Alloy | Composition (weight percent) | | | | | | | | |
|---|---|---|---|---|---|---|---|---|---|
|  | Al | Ta | Cr | W | Mo | Re | Nb | Co | Ti | Ru |
| #20 | 5.5 | 8.0 | 4.5 | 5.0 | 1.0 | 7.5 | 0 | 7.5 | 0 | 0 |
| #938 | 5.5 | 8.0 | 5.0 | 6.0 | 0 | 6.0 | 0 | 7.5 | 1.0 | 3.0 |
| #B1 | 5.3 | 10.4 | 5.0 | 6.7 | 1.0 | 4.0 | 0 | 6.0 | 0 | 0 |
| #B2 | 5.7 | 9.0 | 5.0 | 6.0 | 1.0 | 5.0 | 0 | 0 | 0 | 0 |
| #B6 | 5.5 | 9.0 | 5.0 | 6.7 | 1.0 | 4.0 | 0 | 7.5 | 0.5 | 0 |
| #B7 | 5.5 | 9.0 | 5.0 | 6.0 | 1.0 | 4.7 | 0 | 7.5 | 0.5 | 0 |
| #B11 | 6.6 | 7.0 | 4.8 | 3.0 | 1.5 | 5.5 | 0 | 12.5 | 0 | 0 |
| #947 | 5.5 | 8.4 | 4.0 | 4.5 | 2.0 | 6.0 | 0.5 | 12.5 | 0 | 0 |
| #948 | 5.5 | 8.4 | 4.0 | 4.5 | 1.3 | 6.0 | 0.5 | 4.0 | 0 | 0 |
| #950 | 5.5 | 8.4 | 4.0 | 4.5 | 1.0 | 7.0 | 0.5 | 7.5 | 0 | 0 |
| #951 | 5.5 | 8.4 | 4.0 | 4.5 | 1.0 | 6.0 | 0.5 | 4.0 | 0 | 3.0 |
| C7 | 6.6 | 7.0 | 4.5 | 5.0 | 0 | 5.5 | 0 | 12.5 | 0 | 3.0 |
| C8 | 5.5 | 8.5 | 4.0 | 4.0 | 0 | 6.0 | 0 | 12.5 | 0 | 2.0 |
| C9 | 5.5 | 8.0 | 4.0 | 6.0 | 0 | 5.5 | 0 | 12.5 | 1.0 | 3.0 |
| #C10 | 5.5 | 7.5 | 4.0 | 6.0 | 0 | 5.5 | 0 | 10.0 | 0 | 2.0 |
| G | 5.8 | 8.1 | 4.0 | 4.7 | 0.7 | 6.5 | 0 | 13.0 | 0.7 | 1.0 |
| 1A | 6.2 | 7.0 | 4.5 | 6.0 | 0 | 6.5 | 0 | 12.0 | 0 | 0 |
| 1B | 6.2 | 7.0 | 4.5 | 6.0 | 0.5 | 6.5 | 0 | 12.0 | 0 | 0 |
| #2A | 5.6 | 8.0 | 4.0 | 4.5 | 2.0 | 6.0 | 0 | 12.5 | 0 | 0 |
| #2B | 5.6 | 8.0 | 4.0 | 4.5 | 2.0 | 6.0 | 0.5 | 12.5 | 0 | 0 |
| 3A | 6.6 | 7.1 | 4.4 | 5.2 | 0 | 5.5 | 0 | 12.4 | 0 | 3.0 |
| 3B | 5.7 | 8.0 | 5.0 | 5.5 | 0 | 6.0 | 0 | 12.5 | 0.5 | 3.0 |
| #4 | 5.7 | 8.0 | 4.0 | 4.5 | 1.0 | 6.0 | 0.5 | 4.0 | 0 | 3.0 |
| 5A | 6.1 | 7.0 | 4.5 | 5.8 | 0 | 6.2 | 0 | 12.5 | 0 | 0 |
| 5B | 6.2 | 7.0 | 4.5 | 6.0 | 0 | 6.5 | 0 | 12.5 | 0 | 0 |
| 6A | 6.1 | 7.5 | 4.5 | 5.5 | 0 | 6.0 | 0 | 12.5 | 0 | 0 |
| 6B | 6.0 | 8.0 | 5.0 | 5.5 | 0 | 6.0 | 0 | 12.5 | 0 | 0 |

In each of the alloys reported in Table I, the hafnium content was 0.50 percent or less, the carbon content was 0.07 percent or less, the boron content was 0.0075 percent or less, and the yttrium content was 0.030 percent or less. In the following Table II, an asterisk (*) means that no measurement was made.

A number of physical and mechanical properties of the superalloys whose compositions are reported in Table I were calculated or measured, and these properties are reported in Table II. Table II includes the property values for the preferred alloy as well as the property values for the other compositions of Table I which are considered to be representative of the alloys tested. The melts were solidified as single crystals by growth through a constriction, producing [001] $f_{cc}$ oriented crystals.

Referring to the properties reported in Table II, the density ("Dens.") in pounds per cubic inch is calculated from the composition and the known densities of the elements forming the alloy. All other mechanical properties were measured. Creep properties are reported as the number of hours to failure under particular conditions of temperature and loading. The nomenclature is expressed as "Temperature in degrees° F./thousands of pounds per square inch of loading". Thus, for example, a number of hours for the entry "2000/20" refers to the number of hours before the sample failed at a temperature of 2000° F. and a loading of 20,000 pounds per square inch. After creep testing, samples were sectioned, polished, and etched to highlight TCP phases. The amount of TCP phases present was evaluated metallographically on a qualitative scale of 0-10, with 0 the least amount of TCP phases and 10 the greatest amount. More TCP phase formation was evident at the higher test temperatures. Thus, values of "TCP" reported in Table II represent the TCP value observed at test temperatures of 2000° F., the TCP values observed at test temperatures of 1800° F. being consistently lower.

TABLE II

| Alloy | Dens. | Time to Failure (hours) | | | | TCP |
|---|---|---|---|---|---|---|
|  |  | 2000/20 | 1800/45 | 2000/18 | 1800/40 |  |
| 20 | .330 | 229.0 | 142.9 | * | * | 2.5 |
| 938 | .327 | 167.9 | 175.5 | * | * | 8.0 |
| B1 | .333 | 127.6 | 110.0 | * | * | 8.0 |
| B2 | .326 | 114.2 | 102.4 | * | * | 9.0 |
| B6 | .326 | 87.3 | 143.8 | * | * | 9.0 |
| B7 | .327 | 85.3 | 103.7 | * | * | 9.0 |
| B11 | .316 | 132.8 | 106.3 | * | * | 3.0 |
| 947 | .327 | 476.4 | 147.0 | * | * | 3.0 |
| 948 | .327 | 248.3 | 120.9 | * | * | 2.0 |
| 950 | .328 | 267.9 | 175.6 | * | * | 6.0 |
| 951 | .329 | 667.2 | 193.7 | * | * | 2.0 |
| C7 | .319 | 258.1 | 211.8 | .* | * | 1.0 |
| C8 | .327 | 24.3 | * | * | * | 0 |
| C9 | .327 | 305.1 | 181.5 | * | * | 0 |
| C10 | .325 | 64.9 | 60.3 | * | * | 0 |
| G | .324 | 433.0 | 298.0 | * | * | 0.5 |
| 1A | .323 | * | * | 566.2 | 282.6 | 3.0 |
| 1B | .323 | * | * | 408.0 | 277.0 | 4 |
| 2A | .325 | * | * | 922.5 | 300.0 | 2.0 |
| 2B | .325 | * | * | 989.0 | 267.0 | 3.0 |
| 3A | .322 | * | * | 474.5 | 326.3 | 0.5 |
| 3B | .327 | * | * | 1195.2 | 484.2 | 1.0 |
| 4 | .327 | * | * | 920.0 | 301.0 | 1.0 |
| 5A | .322 | * | * | 444.4 | 335.0 | 1.0 |
| 5B | .322 | * | * | 299.0 | 221.0 | 4.0 |
| 6A | .317 | * | * | 420.0 | 293.0 | 0.5 |
| 6B | .320 | * | * | 420.0 | 347.0 | 3.0 |

These results demonstrate that a high rhenium content, in the 5.5 to 8 percent range, provides excellent strength and stability (low TCP number), particularly where the molybdenum content is maintained below 1 percent, and preferably 0. A high cobalt content, in the 12 to 14 percent range, yields good stability (low TCP number) and, in combination with the high rhenium content, a high strength material.

Heats 1A, 1B, 2A, 2B, 3A, 3B, 4, 5A, 5B, 6A and 6B were large-scale heats, typical of production melting, while the other heats were melted in the laboratory. The large-scale heats, which were within the scope of the invention, exhibited excellent strength, stability, and environmental resistance. Heat 3B, with a ruthenium content of about 3.0 percent, had particularly good elevated temperature strength properties.

The preferred composition for this invention is represented by alloy 5A. This composition was selected because it has a balanced chemistry which does not contain molybdenum, titanium or vanadium, all of which are detrimental to environmental resistance (hot corrosion and/or oxidation), or the expensive ruthenium, and because it has the best balance of properties for high temperature turbine airfoil applications. This composition exhibits excellent stability with only minor precipitation of unstable TCP phases after long time high temperature exposure. This alloy also has an acceptable density (0.322 lbs/in³).

Figure 2:
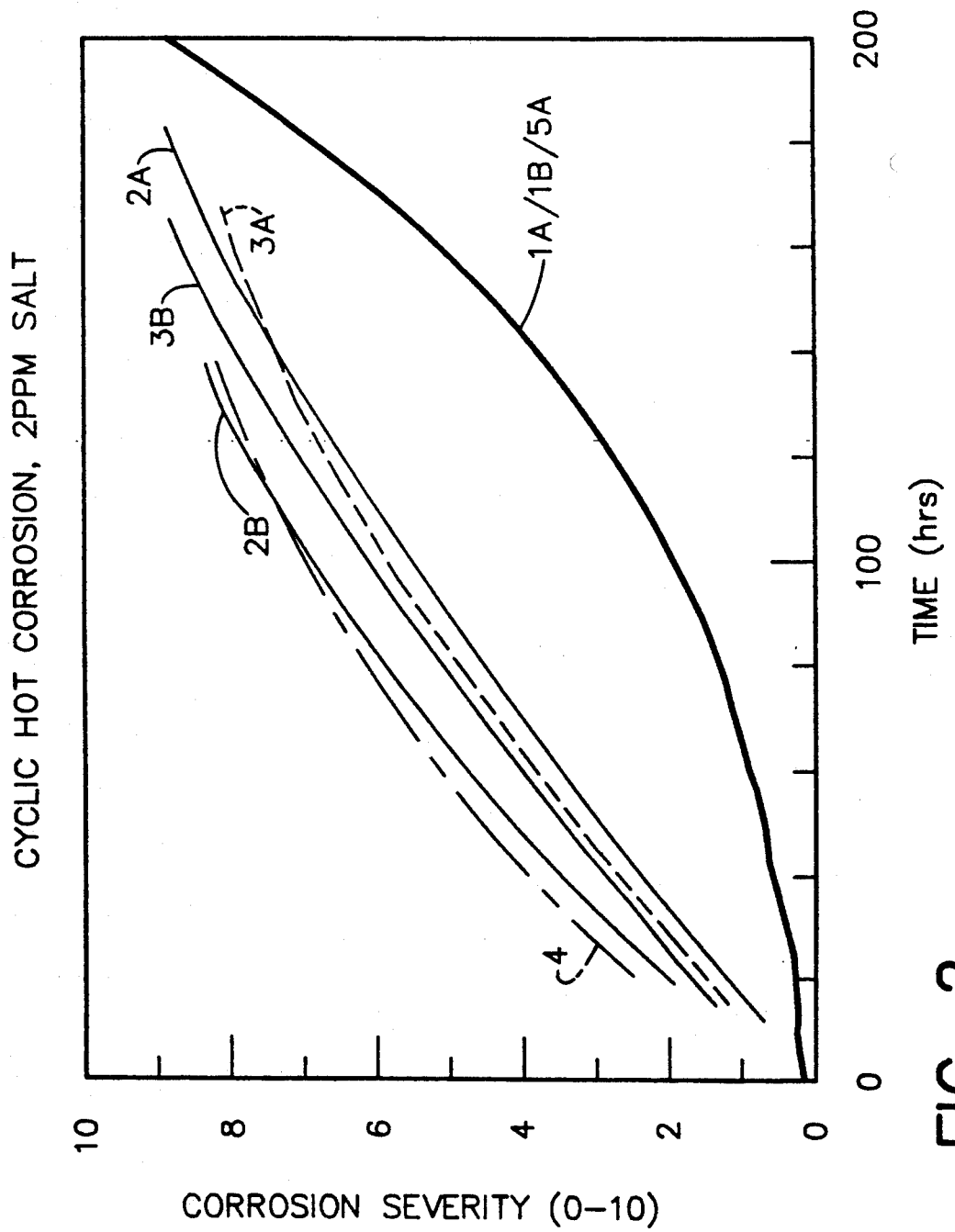
FIG. 2 is a graph of cyclic hot corrosion test results for selected alloys.

Alloy 5A also exhibits the best hot corrosion resistance among the alloys tested. Hot corrosion testing is performed by mounting 0.125" diameter by 1.5" long specimens into a rotatable fixture. The fixture is placed into a burner rig having an atmosphere of 2 parts per million NaCl which cycles continuously from 1500° F. to 1650° F. except for a brief period once per day when the temperature is cycled to ambient. Specimens are removed from the rotating fixture, visually inspected at 2× magnification and rated on a scale of 1 to 10 by comparison to a set of standards, with one representing a specimen having slight corrosive attack with only surface discoloration, and ten representing total specimen consumption. The test results of the alloys tested are shown in FIG. 2, which provides the corrosion severity rating as the ordinate and the time tested as the abscissa for the alloys tested.

Figure 3:
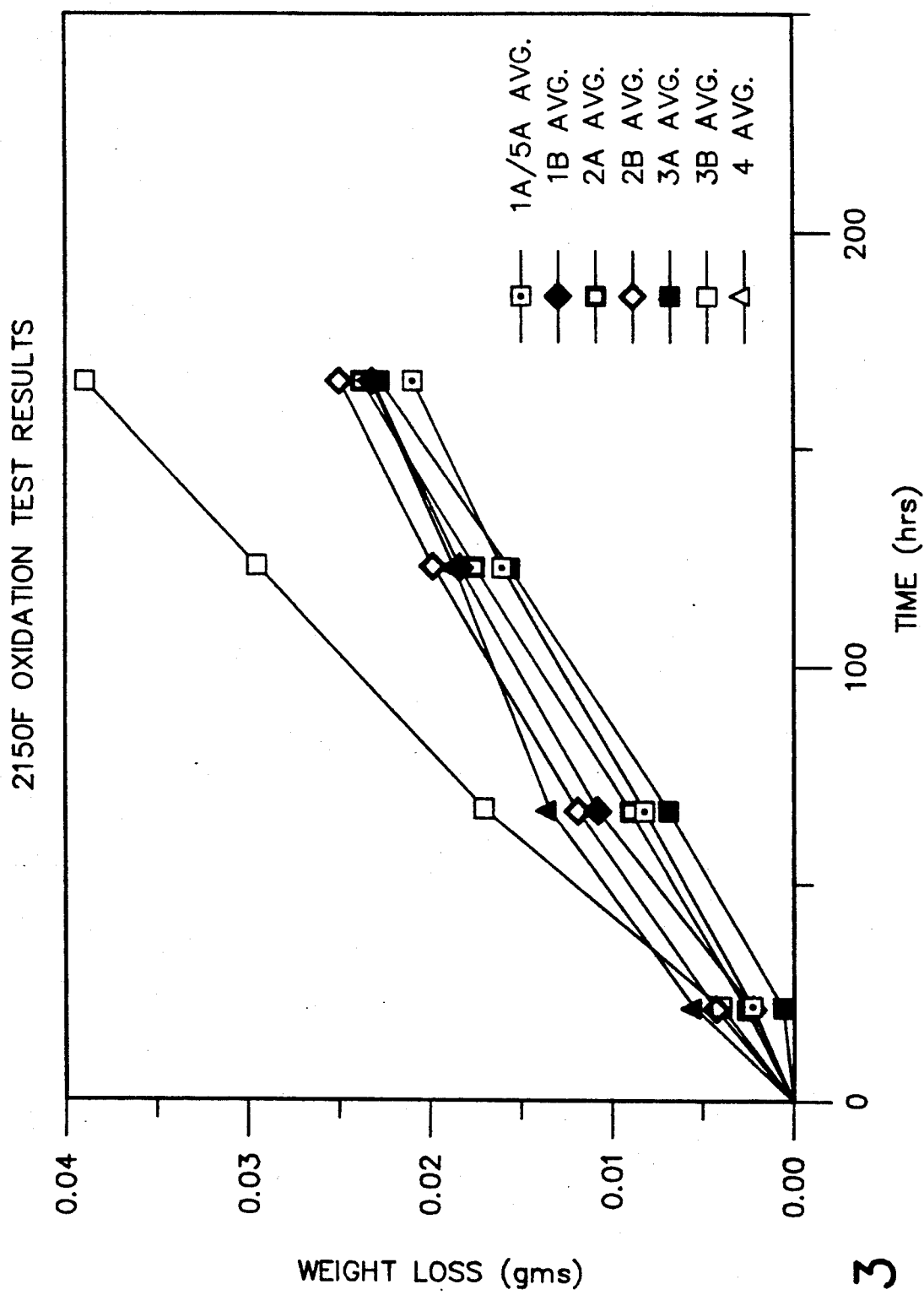
FIG. 3 is a graph of oxidation test results for selected alloys.

Alloy 5A also exhibits outstanding high velocity oxidation resistance at 2150° F. among the alloys tested, having a 0.05 gram weight loss (about 0.25%) after 200 hours of testing. Oxidation resistance is performed by mounting 0.23" diameter by 3.5" long test specimens on a rotating radial wheel and exposing the specimens to air cycled hourly from ambient to a temperature of about 2150° F. and moving at a speed of Mach 1. The specimens are examined every twenty four hours. The test results of the alloys tested are shown in FIG. 3, which provides the weight loss (in grams) as the ordinate and the time tested as the abscissa.

Figure 4:
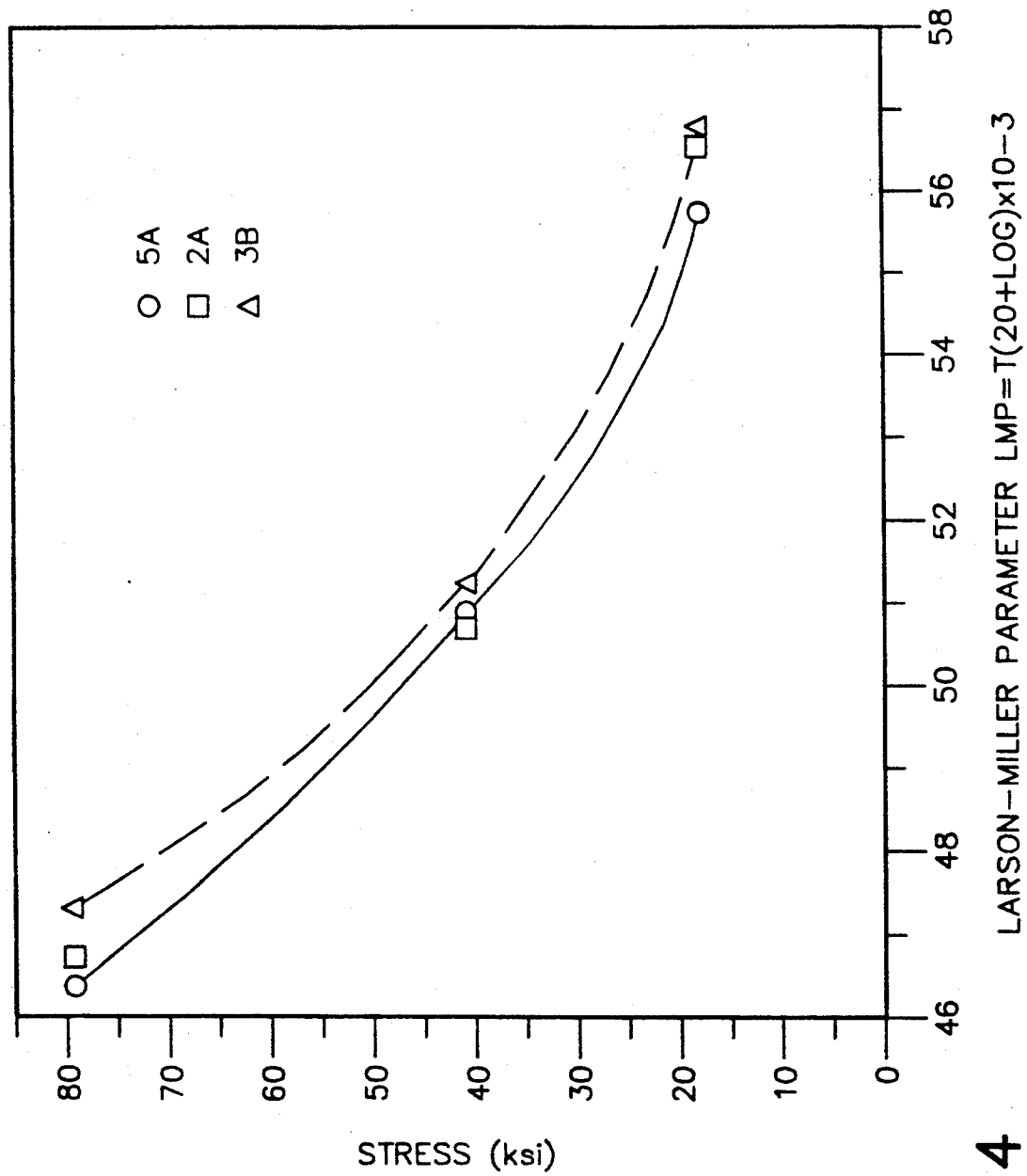
FIG. 4 is a graph of stress rupture in terms of the Larson-Miller Parameter vs. stress for selected alloys of the present invention.

The creep-rupture behavior of some of the alloys of the present invention are presented graphically on FIG. 4. Two of the heats, 3A and 3B, although within the scope of this invention, are not among the preferred alloy combinations because they contain the expensive and geopolitically sensitive ruthenium. The creep results for the ruthenium-containing heats, on the average, are superior to the non-ruthenium containing heats.

The superalloys of the present invention provide an important advance in this art, permitting increased operational temperatures and excellent long-term high temperature stability. Although the present invention has been described in connection with specific examples and embodiments, it will be understood by those skilled in the art involved that the present invention is capable of modification without departing from its spirit and scope as represented by the appended claims. Numerous modifications, changes, substitutions and equivalents will now become apparent to those skilled in the art, all of which fall within the scope contemplated by the invention herein.

What is claimed is:

1. A nickel-based superalloy consisting essentially of, in weight percent, from about 4 to about 5 percent chromium, from about 12 to about 13 percent cobalt, from about 4 to about 8 percent tungsten, from about 6 to about 8 percent tantalum, from about 5 to about 7 percent aluminum, from about 5.7 to about 7 percent rhenium, from about 0.12 to about 0.18 percent hafnium, from about 0.4 to about 0.06 percent carbon, from 0 to about 0.0075 percent boron, from about 0.002 to about 0.030 percent yttrium, from 0 to about 6 percent ruthenium, from 0 to about 1 percent molybdenum, from 0 to about 1 percent niobium, and the balance essentially nickel, the superalloy further characterized by improved environmental resistance and stress rupture resistance.

2. The superalloy of claim 1, wherein the rhenium content is from about 6.0 percent to about 6.4 percent.

3. The superalloy of claim 1, wherein the boron content is from about 0.0030 to about 0.0050 percent.

4. The superalloy of claim 1, wherein the chromium content is from about 4.25 to about 4.75 percent.

5. The superalloy of claim 1, wherein the cobalt content is from about 12.25 to about 12.75 percent.

6. The superalloy of claim 1, wherein the tungsten content is from about 5.6 to about 5.9 percent.

7. The superalloy of claim 1, wherein the tantalum content is from about 6.8 to about 7.2 percent.

8. The superalloy of claim 1, wherein the aluminum content is from about 6.0 to about 6.2 percent.

9. An article made from the superalloy of claim 1.

10. The article of claim 9 wherein said article is a single crystal.

11. The article of claim 9 wherein said article is a component for a gas turbine engine.

12. The gas turbine engine component of claim 11 wherein said component is a turbine airfoil.

13. The article of claim 10 wherein said article is a turbine airfoil for a gas turbine engine.

14. A nickel-based superalloy consisting essentially of, in weight percent, from about 4.25 to about 4,75 percent chromium, from about 12.25 to about 12.75 percent cobalt, from about 5.6 to about 5.9 percent tungsten, from about 6.8 to about 7.2 percent tantalum, from about 6.0 to about 6.2 percent aluminum, from about 6.0 to about 6.4 percent rhenium, from about 0.12 to about 0.18 percent hafnium, from about 0.04 to about 0.06 percent carbon, from 0.030 to about 0.0050 percent boron, from about 0.002 to about 0.030 percent yttrium, from 0 to about 6 percent ruthenium, from 0 to about 1 percent molybdenum, from 0 to about 1 percent niobium, and the balance essentially nickel, the superalloy further characterized by improved environmental resistance and stress rupture resistance.

15. An article made from the superalloy of claim 14.

16. The article of claim 15 wherein said article is a single crystal.

17. The article of claim 15 wherein said article is a component for a gas turbine engine.

18. The article of claim 16 wherein said article is a component for a gas turbine engine.

19. The gas turbine engine component of claim 18 wherein said component is a turbine airfoil.

20. A nickel-based superalloy for use as a single crystal consisting essentially of, in weight percent, about 4.5 percent chromium, about 12.5 percent cobalt, about 5.7 percent tungsten, about 7 percent tantalum, about 6.1 percent aluminum, about 6.2 percent rhenium, about 0.15 percent hafnium, about 0.05 percent carbon, about 0.004 percent boron, and the balance essentially nickel, the superalloy further characterized by improved environmental resistance and stress rupture resistance.

21. An article made from the superalloy of claim 20.

22. The article of claim 21 wherein said article is a single crystal.

23. The article of claim 21 wherein said article is a component for a gas turbine engine.

24. The gas turbine engine component of claim 23 wherein said component is a turbine airfoil.

25. The article of claim 21 wherein said article is a component for a gas turbine engine.

26. The gas turbine enqine component of claim 25 wherein said component is a turbine airfoil.

27. A method of making a nickel-based superalloy comprising the steps of:
heating the superalloy to about 2300° F.;
then, homogenizing the superalloy at 2300° F. for about 2 hours;
then, solutioning the superalloy at about 2415° F. for about 2 hours;
then, cooling the superalloy from the solutioning temperature to about 2050° F. within about three minutes;
then, aging the superalloy for a period of time at about 2050° F.

28. The superalloy prepared by the method of claim 27 wherein the superalloy is heated from the homogenizing temperature to the solutioning temperature at a rate of about 10° F. per hour.

29. The superalloy prepared by the hod of claim 27 wherein the period of time for the alloy at the aging temperature is about 4 hours.

30. The superalloy prepared by the method of claim 27 further including the additional steps of:
cooling from the aging temperature to about 1975° F. in about 1 minute;
then, holding at about 1975° F. for a period of about 4 hours and applying a protective coating;
then, cooling to a temperature of about 1650° F. in less than about 6 minutes and holding at this temperature for about 4 hours.

31. An article made by the method of claim 27.

32. The article of claim 31 wherein said article is a gas turbine engine component.

33. The article of claim 31 wherein said article is a single crystal gas turbine engine component.

34. The article of claim 32 wherein said article is a turbine airfoil.

35. The article of claim 33 wherein said article is a turbine airfoil.

* * * * *

UNITED STATES PATENT AND TRADEMARK OFFICE
CERTIFICATE OF CORRECTION

PATENT NO. : 5,151,249
DATED : September 29, 1992
INVENTOR(S) : Austin, et. al.

It is certified that error appears in the above-indentified patent and that said Letters Patent is hereby corrected as shown below:

Column 9, claim 1, line 61, delete "0.4" and insert therefor --0.04--.

Column 10, claim 14, line 26, delete "4,75" and insert therefor --4.75--;
          claim 14, lien 33, delete "0.0050" and insert therefor --0.050--.

Signed and Sealed this

Twenty-sixth Day of April, 1994

Attest:

BRUCE LEHMAN

*Attesting Officer*  *Commissioner of Patents and Trademarks*